(12) United States Patent
Ishii et al.

(10) Patent No.: US 9,744,551 B2
(45) Date of Patent: Aug. 29, 2017

(54) COATING APPARATUS AND NOZZLE

(71) Applicant: Tokyo Electron Limited, Tokyo (JP)

(72) Inventors: Takayuki Ishii, Kumamoto (JP);
Takahiro Sakamoto, Kumamoto (JP);
Takahiro Kitano, Kumamoto (JP);
Shoichi Terada, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 617 days.

(21) Appl. No.: 13/920,219

(22) Filed: Jun. 18, 2013

(65) Prior Publication Data
US 2014/0000517 A1    Jan. 2, 2014

(30) Foreign Application Priority Data

Jun. 27, 2012    (JP) .................. 2012-144757

(51) Int. Cl.
*B05B 1/04* (2006.01)
*B05C 5/02* (2006.01)
*B05B 12/08* (2006.01)
*H01L 21/67* (2006.01)

(52) U.S. Cl.
CPC ............ *B05C 5/0258* (2013.01); *B05B 1/044* (2013.01); *B05B 12/081* (2013.01); *B05C 5/0254* (2013.01); *H01L 21/6715* (2013.01)

(58) Field of Classification Search
CPC ... B05C 5/0254; B05C 5/0258; B05B 12/081; B05B 1/044
See application file for complete search history.

(56) References Cited

U.S. PATENT DOCUMENTS 5,516,273 A * 5/1996 Delmore et al. .......... 425/192 R

FOREIGN PATENT DOCUMENTS

| JP | 06-190845 A | 7/1994 |
| JP | 08-103710 A | 4/1996 |
| JP | 2001-062368 A | 3/2001 |
| JP | 2008-114137 A | 5/2008 |
| JP | 2008-178818 A | 8/2008 |
| JP | 2011-167603 A | 9/2011 |

* cited by examiner

*Primary Examiner* — Dah-Wei D Yuan
*Assistant Examiner* — Stephen Kitt
(74) *Attorney, Agent, or Firm* — Abelman, Frayne & Schwab

(57) ABSTRACT

Disclosed is a coating apparatus capable of enhancing the film thickness uniformity. The coating apparatus includes a nozzle and a moving mechanism. The nozzle includes a storage chamber that stores a coating liquid and a slit-like flow path that is in communication with the storage chamber, and discharges the coating liquid through a discharge port formed at a front end of the flow path. The moving mechanism moves the nozzle and the substrate relatively to each other along a surface of the substrate. Also, in the flow path provided in the nozzle, flow resistance at the central portion in the longitudinal direction is larger than that at both end portions in the longitudinal direction.

12 Claims, 16 Drawing Sheets

COATING APPARATUS AND NOZZLE

CROSS-REFERENCE TO RELATED APPLICATIONS

This application is based on and claims priority from Japanese Patent Application No. 2012-144757, filed on Jun. 27, 2012, with the Japan Patent Office, the disclosure of which is incorporated herein in its entirety by reference.

TECHNICAL FIELD

Disclosed embodiments are related to a coating apparatus and a nozzle.

BACKGROUND

Conventionally, a spin coating method has been known as a coating method in which a coating liquid is applied on a substrate such as, for example, a semiconductor wafer or a glass substrate. The spin coating method refers to a method of forming a coating film by dropping a coating liquid from a nozzle onto a central portion of the substrate while rotating the substrate so that the coating liquid is diffused on the substrate by a centrifugal force and spread to be coated on the substrate to form a coating film.

In the spin coating method, most of the coating liquid dropped out onto the substrate is scattered out of the substrate. Thus, the usage efficiency of the coating liquid tends to be low. Therefore, a slit coating method has recently been proposed as a coating method to replace the spin coating method.

The slit coating method refers to a method of coating using a nozzle having a slit-like discharge port. Specifically, in the slit coating method, a coating liquid, which is slightly exposed from the discharge port of the nozzle is brought into contact with a substrate and in this state, the nozzle and the substrate are relatively moved such that the coating liquid is spread and coated on the substrate to form a coating film. According to the slit coating method, the utilization efficiency of the coating liquid may be enhanced because the coating liquid can be applied on the substrate as needed. See, e.g., Japanese Patent Laid-Open No. 2011-167603.

SUMMARY

An exemplary embodiment of the present disclosure provides a coating apparatus. The coating apparatus includes: a nozzle provided with a storage chamber that stores a coating liquid and a slit-like flow path that is in communication with the storage chamber, and configured to discharge the coating liquid through a discharge port formed at a front end of the flow path; and a moving mechanism configured to move the nozzle and the substrate relatively to each other along a surface of the substrate. In the flow path provided in the nozzle, a flow resistance at the central portion in the longitudinal direction is larger than that at both end portions in the longitudinal direction.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
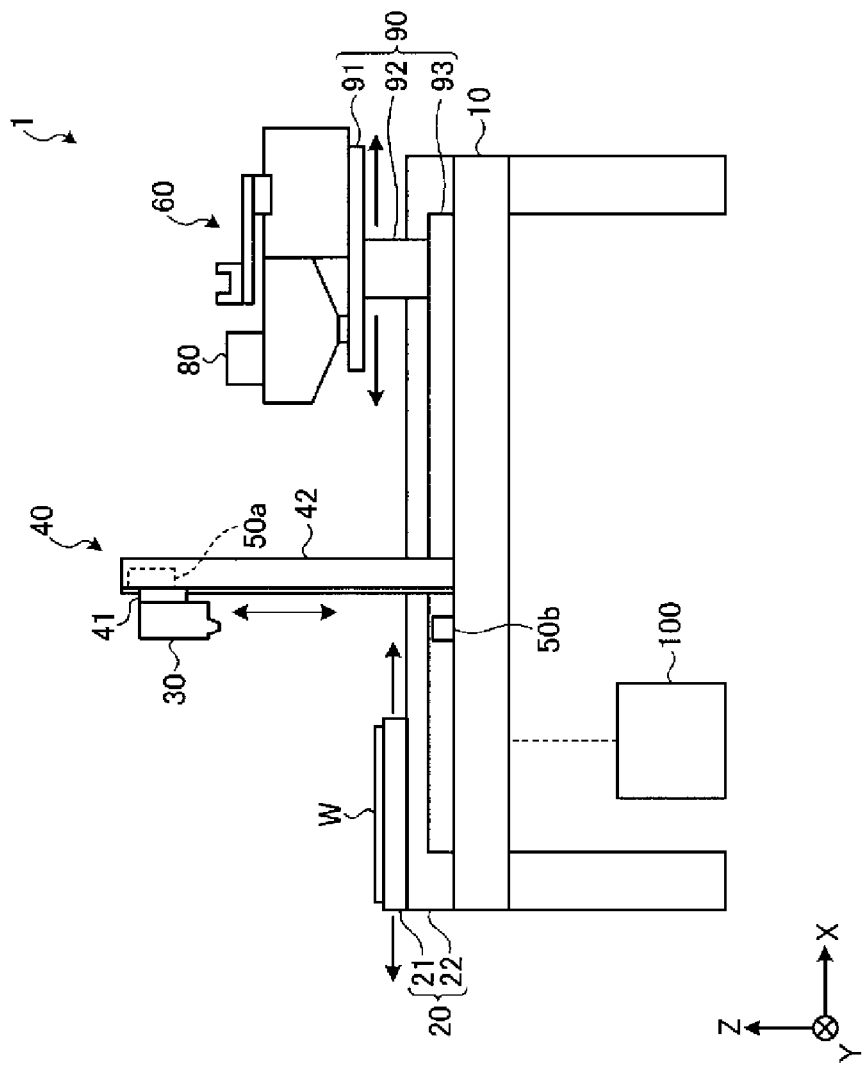
FIG. 1 is a schematic side view illustrating a configuration of a coating apparatus according to a first embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

However, there is room for improvement in the above described conventional technology in connection with enhancing the film thickness uniformity.

For example, when coating is performed using the above-described slit coating process, there is a concern that the film thickness at both end portions in a longitudinal direction of the nozzle becomes thinner than that at the central portion of the longitudinal direction of the nozzle. One of the reasons of causing the film thickness difference may be that the coating liquid applied on the substrate agglomerates toward the center due to the surface tension.

An aspect of the embodiment of the present disclosure is to provide a coating apparatus and a nozzle capable of enhancing film thickness uniformity.

An aspect of the present disclosure provides a coating apparatus which includes a nozzle and a moving mechanism. The nozzle includes a storage chamber that stores a coating liquid and a slit-like flow path that is in communication with the storage chamber, and configured to discharge the coating liquid through a discharge port formed at a front end of the flow path. The moving mechanism configured to move the nozzle and the substrate relatively to each other along a surface of the substrate. Also, in the flow path provided in the nozzle, a flow resistance at the central portion in the longitudinal direction is larger than that at both end portions in the longitudinal direction.

In the coating apparatus, the nozzle has an elongated land formed in the flow path and the central portion in the longitudinal direction protrudes towards the storage chamber side.

In the coating apparatus, the land has a boundary portion between the land and the storage chamber, and the boundary portion is formed in a step shape when viewed from a width direction.

In the coating apparatus, the land has a boundary portion with the storage chamber and the boundary portion is formed in a curved shape when viewed from a width direction.

In the coating apparatus, the shape of the land is determined based on a thickness distribution of the coating liquid coated using a nozzle provided with a land of which the boundary portion with the storage chamber is flat.

The coating apparatus further includes a pressure adjusting unit configured to adjust the pressure inside the storage chamber; and a pressure control unit configured to control the pressure adjusting unit to adjust the pressure inside the storage chamber such that a discharge amount of the coating liquid becomes constant while the coating liquid is being coated on the substrate.

The coating apparatus further includes a liquid surface detecting unit configured to detect a liquid surface of the coating liquid stored in the storage chamber.

The coating apparatus further includes a coating processing control unit configured to determine whether the liquid surface becomes flat based on a detection result of the liquid surface detecting unit, and when it is determined that the liquid surface become flat, to start a coating processing using the nozzle.

In the coating apparatus, a portion of the storage chamber is formed with a transparent material and the liquid surface detecting unit detects the liquid surface through the transparent material from the outside of the nozzle.

The coating apparatus further includes a prism configured to reflect or refract light, and the liquid surface detecting unit is disposed obliquely with respect to the liquid surface at a predetermined angle and captures an image of the liquid surface viewed from a direction substantially parallel to the liquid surface through the prism.

The coating apparatus further includes a liquid supply port configured to supply the coating liquid to the storage chamber, and the liquid supply port has a slit shape extending in the longitudinal direction of the flow path.

Another aspect of the present disclosure provides a nozzle which includes: a storage chamber configured to store a coating liquid therein; a slit-like flow path that is in communication with the storage chamber; and a discharge port formed at a front end of the flow path. In the flow path, a flow resistance at the central portion in the longitudinal direction is larger than that at both end portions in the longitudinal direction.

According to the above-described aspects, film thickness uniformity may be enhanced.

Hereinafter, exemplary embodiments of a coating apparatus and a nozzle disclosed in the present application are described in detail with reference to the accompanying drawings. However, the present disclosure is not limited to the exemplary embodiments described below.

First Exemplary Embodiment

FIG. 1 is a schematic side view illustrating a configuration of a coating apparatus according to a first exemplary embodiment of the present disclosure. Further, in the following description, X-axis, Y-axis and Z-axis perpendicular to each one another are defined in order to clearly indicate a positional relationship, and the positive direction of the Z-axis is defined as a vertically upward direction.

As illustrated in FIG. 1, the coating apparatus 1 according to the first exemplary embodiment includes a disposing table 10, a first moving mechanism 20, a nozzle 30 and an elevation mechanism 40.

The first moving mechanism 20 is a mechanism which moves a substrate W in a horizontal direction and includes a substrate holding unit 21 and a driving unit 22. The substrate holding unit 21 is provided with a horizontal top surface in which a suction port is formed and attracts and holds the substrate W on the horizontal top surface by suction from the suction port. The driving unit 22 is disposed on the disposing table 10 and moves the substrate holding unit 21 in the horizontal direction (here, X-axis direction). The first moving mechanism 20 moves the substrate holding unit 21 using the driving unit 22 to move the substrate W held on the substrate holding unit 21 in the horizontal direction.

The nozzle 30 is an elongated nozzle extending in a direction (Y-axis direction) perpendicular to a movement direction (X-axis direction) of the substrate W and is disposed above the substrate W. The configuration of the nozzle 30 will be described below.

The elevation mechanism 40 is a mechanism which elevates the nozzle 30 and includes a fixing unit 41 and a driving unit 42. The fixing unit 41 is a member which fixes the nozzle 30. Further, the driving unit 42 moves the fixing unit 41 in the vertical direction. The elevation mechanism 40 moves the fixing unit 41 in the vertical direction using the fixing unit 41 to elevate the nozzle 30 fixed to the fixing unit 41.

Further, the coating apparatus 1 includes a thickness measuring unit 50a, a nozzle height measuring unit 50b, a nozzle cleaning unit 60, a nozzle stand-by unit 80, a second moving mechanism 90, and a control device 100.

The thickness measuring unit 50a is disposed above the substrate W (here, the elevation mechanism 40), and is a measuring unit which measures the distance to the top surface of the substrate W. Further, the nozzle height measuring unit 50b is disposed below the substrate W (here, the disposing table 10) and measures a distance to the lower end surface of the nozzle 30.

The measurement results by the thickness measuring unit 50a and the nozzle height measuring unit 50b are transmitted to the control device 100 to be described below and are used for determining the height of the nozzle 30 at the time of a coating processing. Further, for example, a laser displacement meter may be used as the thickness measuring unit 50a and the nozzle height measuring unit 50b.

The nozzle cleaning unit 60 is a processing unit which removes the coating liquid adhered to a front end portion of the nozzle 30. The configuration of the cleaning unit 60 will be described below.

The nozzle stand-by unit 80 includes a receiving space capable of receiving the nozzle 30. The inside of the receiving space is maintained in a thinner atmosphere and the nozzle 30 is allowed to be in standby to prevent the coating liquid contained in the nozzle 30 from being dried. The configuration of the nozzle stand-by unit 80 will also be described below.

The second moving mechanism 90 is a mechanism which moves the nozzle cleaning unit 60 and the nozzle stand-by unit 80 in the horizontal direction, and includes a disposing unit 91, a supporting unit 92, and a driving unit 93.

The disposing unit 91 is a flat member which disposes the nozzle cleaning unit 60 and the nozzle stand-by unit 80 substantially horizontally. The disposing unit 91 is supported at a height determined by the supporting unit 92, specifically, at a height where the substrate W maintained on the substrate holding unit 21 may pass below the disposing unit 91. The driving unit 93 moves the supporting unit 92 in the horizontal direction.

The second moving mechanism 90 moves the supporting unit 92 in the horizontal direction using the driving unit 93 to move the nozzle cleaning unit 60 and the nozzle stand-by unit 80 disposed on the disposing unit 91 in the horizontal direction.

The control device 100 is a device which controls an operation of the coating apparatus 1. The control device 100 is, for example, a computer, and includes a control unit and a storage unit not illustrated herein. A program which controls various processings such as the coating processing is stored in the storage unit. The control unit reads out and executes a program stored in the storage unit to control the operation of the coating apparatus 1.

Further, the program may be recorded on a computer readable recording medium and may be installed on a storage unit of the control device 100 from the computer readable recording medium. The computer readable recording medium may be, for example, a hard disk (HD), a flexible disk (FD), a compact disk (CD), a magneto-optical disk (MO), or a memory card.

Figure 2A:
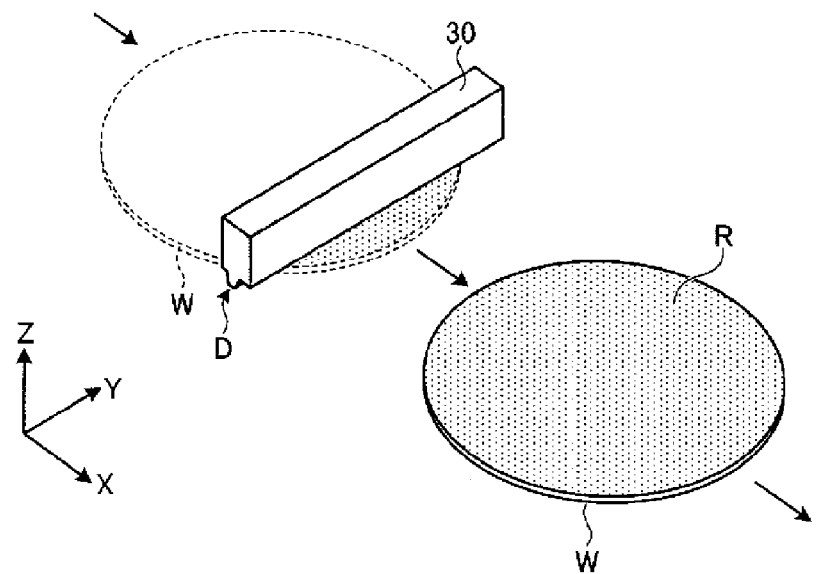
FIG. 2A is an explanatory view schematically illustrating a coating processing.
Figure 2B:
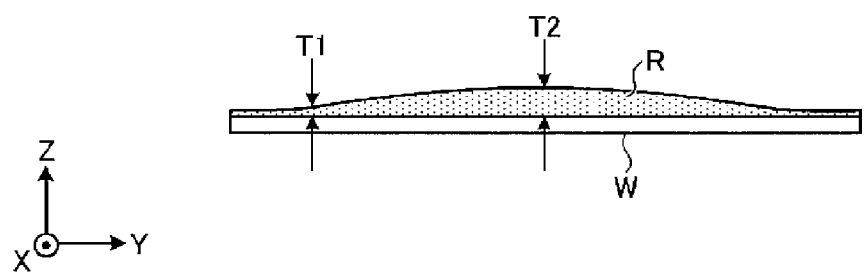
FIG. 2B is a view illustrating a substrate after the coating processing viewed from a scanning direction.

Next, the configuration of the nozzle 30 and the contents of the coating processing performed by the coating apparatus 1 will be described in detail. First, an outline of the coating processing is described with reference to FIG. 2A and FIG. 2B. FIG. 2A is an explanatory view schematically illustrating a coating processing. FIG. 2B is a schematic view illustrating a substrate W after the coating processing viewed from a scanning direction.

In the coating processing performed by the coating apparatus 1, the substrate W is moved in the horizontal direction while the coating liquid exposed from the elongated nozzle 30 is in contact with the substrate W to spread and coat the coating liquid on the substrate W, thereby forming a coating film.

As illustrated in FIG. 2A, the nozzle 30 is an elongated member extending in a direction (Y-axis direction) perpendicular to the movement direction (X-axis direction) of the substrate W and discharges a coating liquid R from an elongated discharge port D formed at the lower end portion thereof.

The coating apparatus 1 exposes the coating liquid R from the elongated discharge port D first. In this case, the coating apparatus 1 may control the pressure inside the nozzle 30 to maintain a state in which the coating liquid R is exposed from the elongated discharge port D. However, this will be described below.

Subsequently, the coating apparatus 1 moves the nozzle 30 downwardly using the elevation mechanism 40 (see FIG. 1) and brings the coating liquid R exposed from the elongated discharge port D into contact with a top surface of the substrate W. Also, the coating apparatus 1 moves the substrate W horizontally using the first moving mechanism 20 (see FIG. 1). Accordingly, the coating liquid is spread and coated on the top surface of the substrate W to form a coating film. Further, the coating film formed by the coating apparatus 1 is a thick film having a thickness of 10 µm or more.

When the coating liquid is coated on a substrate using a conventional nozzle, there is a concern that the film thickness uniformity in a longitudinal direction of the nozzle may be degraded. Specifically, as illustrated in FIG. 2B, the film thickness T1 at both end portions in the longitudinal direction of the nozzle becomes thinner than the film thickness T2 at the central portion in the longitudinal direction of the nozzle. As one of the reasons may be that the coating liquid R coated on the substrate W agglomerate toward the center due to surface tension.

Therefore, the coating apparatus 1 according to the first embodiment is configured such that the flow resistance at the central portion in the longitudinal direction is larger than that at both end portions in the longitudinal direction. Accordingly, the discharge amount of the coating liquid at the central portion in the longitudinal direction may be reduced to be smaller than that at both end portions in the longitudinal direction. Therefore, the film thickness uniformity may be enhanced as compared to the conventional nozzle having a uniform resistance of a flow path.

Figure 3A:
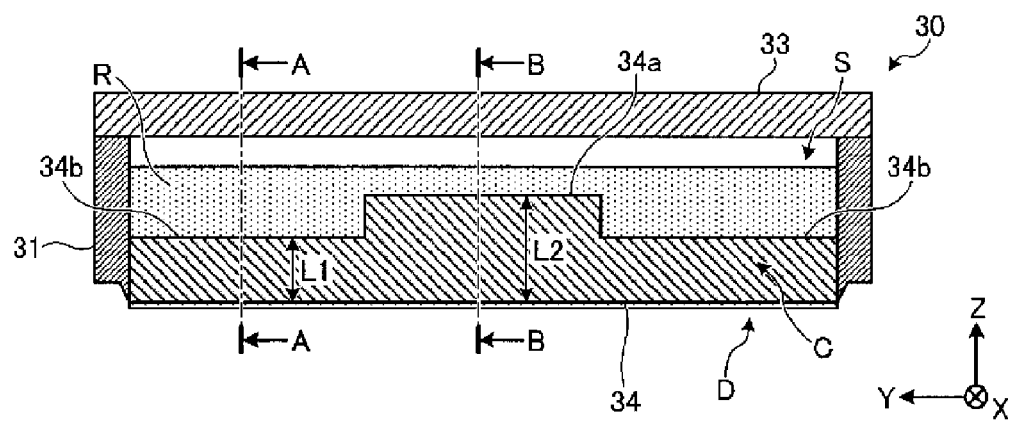
FIG. 3A is a schematic cross-sectional view illustrating a configuration of a nozzle.
Figure 3B:
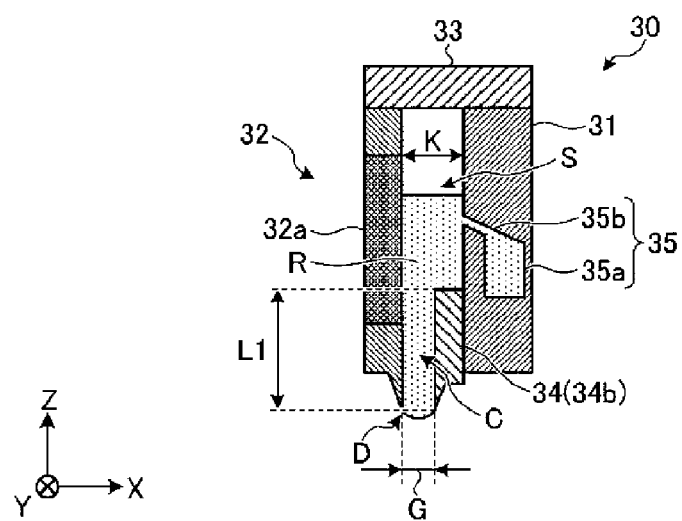
FIG. 3B is a cross-sectional view taken along line A-A in FIG. 3A.
Figure 3C:
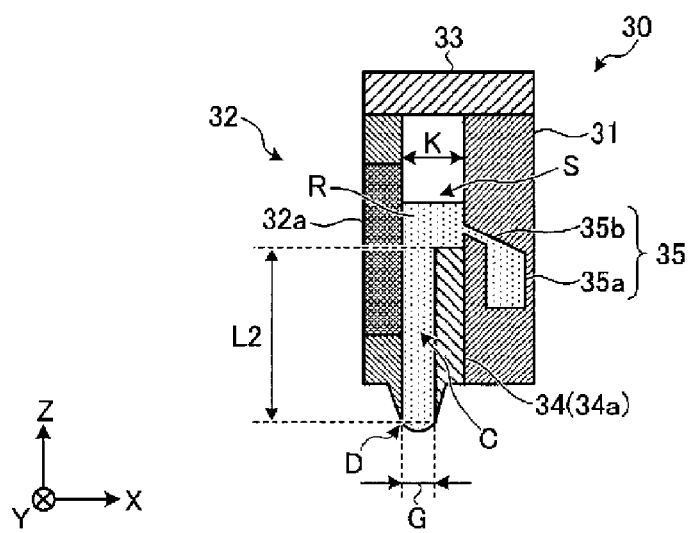
FIG. 3C is a cross-sectional taken along line B-B in FIG. 3A.

Hereinafter, the configuration of the nozzle 30 will be described in detail with reference to FIGS. 3A to 3C. FIG. 3A is a schematic front cross-sectional view illustrating a configuration of a nozzle 30. FIG. 3B is a cross-sectional view taken along line A-A in FIG. 3A. FIG. 3C is a cross-sectional view taken along line B-B in FIG. 3A.

As illustrated in FIGS. 3A 3B, the nozzle 30 includes a storage chamber S in which the coating liquid R is stored and a slit-like flow path C disposed at a lower portion of the storage chamber S and in communication with the storage chamber S, and discharges the coating liquid R from the discharge port D formed at a front end of the flow path C (that is, the lower end surface of the nozzle 30).

More specifically, the nozzle 30 includes a first main body 31 which forms a rear portion and both lateral portions of the nozzle 30, a second main body 32 which forms a front portion, a cover 33 which forms a ceiling portion, and an elongated land 34 disposed on a surface of the first main body 31 to be opposed to the second main body 32. Also, in a space formed within the nozzle 30 by the first main body 31, the second main body 32 and the cover 33, the space of the width K placed between the first main body 31 and the second main body 32 forms the storage chamber S and the space having the width G narrower than the width K placed between the land 34 and the second main body 32 forms the flow path C. Further, the flow path C has a constant width G, and the width of the discharge port D formed at the front end the flow path C is also G.

The width G is set to a value in such a manner that, in a state where pressure inside the storage chamber S is made equal to pressure outside the storage chamber S, the surface tension of the coating liquid R becomes smaller than the gravity applied to the coating liquid R and the coating liquid R is dropped out from the discharge port D at a predetermined flow rate. Specifically, the width G may be determined by evaluating the condition of the coating liquid R while changing the width G, the viscosity of the coating liquid R, and the material of the nozzle 30 in a test performed in advance to obtain the width G.

In the first exemplary embodiment, the land 34 has a convex shape of which the central portion 34a in the longitudinal direction protrudes towards the storage chamber S, that is, protrudes upwardly, as illustrated in FIG. 3A.

Accordingly, the flow path length of the flow path C, that is, a distance from the boundary portion between the storage chamber S and the flow path C to the discharge port D becomes L2, which is longer than L1, at the central portion 34a in the longitudinal direction (see FIG. 3C) while the distance at both end portions 34b in the longitudinal direction becomes L1 (see FIG. 3B).

The flow resistance becomes larger as the flow path length becomes longer and thus, the coating liquid R becomes difficult to flow. Therefore, the amount of the coating liquid R discharged from the central portion in the longitudinal direction of the discharge port D becomes smaller than that discharged from both end portions of the discharge port D. Accordingly, it is possible to mitigate the deterioration (see FIG. 2B) of the film thickness uniformity which occurs when the conventional nozzle having uniform flow resistance of flow path over the longitudinal direction is used. Therefore, the film thickness uniformity may be improved by using the nozzle 30 according to the first exemplary embodiment compared with the conventional nozzle.

The shape of the land 34 is determined based on a film thickness profile obtained by using the conventional nozzle, specifically, a thickness distribution of the coating liquid R which is coated on the substrate W using a nozzle provided with the land of which boundary portion with the storage chamber is flat. That is, a height or a width of the central portion 34a in the longitudinal direction and both end portions 34b in the longitudinal direction is determined such that a difference between the film thickness T1 at both end portions in the longitudinal direction and the film thickness T2 at the central portion in the longitudinal direction is removed. Accordingly, the deterioration of the film thickness uniformity in the longitudinal direction of the nozzle 30 may be reliably suppressed.

Further, although a step formed in the land 34 is a two-stage step is exemplified in FIG. 3, a step to be formed in the land may be a three or more-stage step.

Further, here, although the boundary portion between the land 34 and the storage chamber S is exemplified as being formed in a step shape when viewed in the width direction (X-axis direction), the shape of the land is not limited to the step shape. Another shape of the land is illustrated in FIG. 4.

Figure 4:
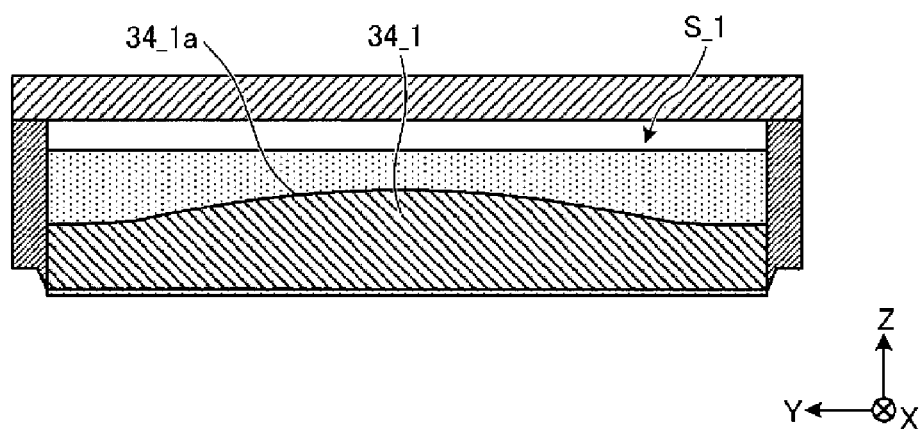
FIG. 4 is a vertical cross-sectional view illustrating another shape of a land.

For example, as illustrated in FIG. 4, the boundary portion 34_1a of the land 34_1 with the storage chamber S_1 may be formed in a curved shape when viewed in the width direction (X-axis direction). In this way, the land is formed in a curved shape such that the film thickness profile obtained by using the conventional nozzle may be reflected more accurately and the film thickness uniformity may be enhanced.

Figure 5:
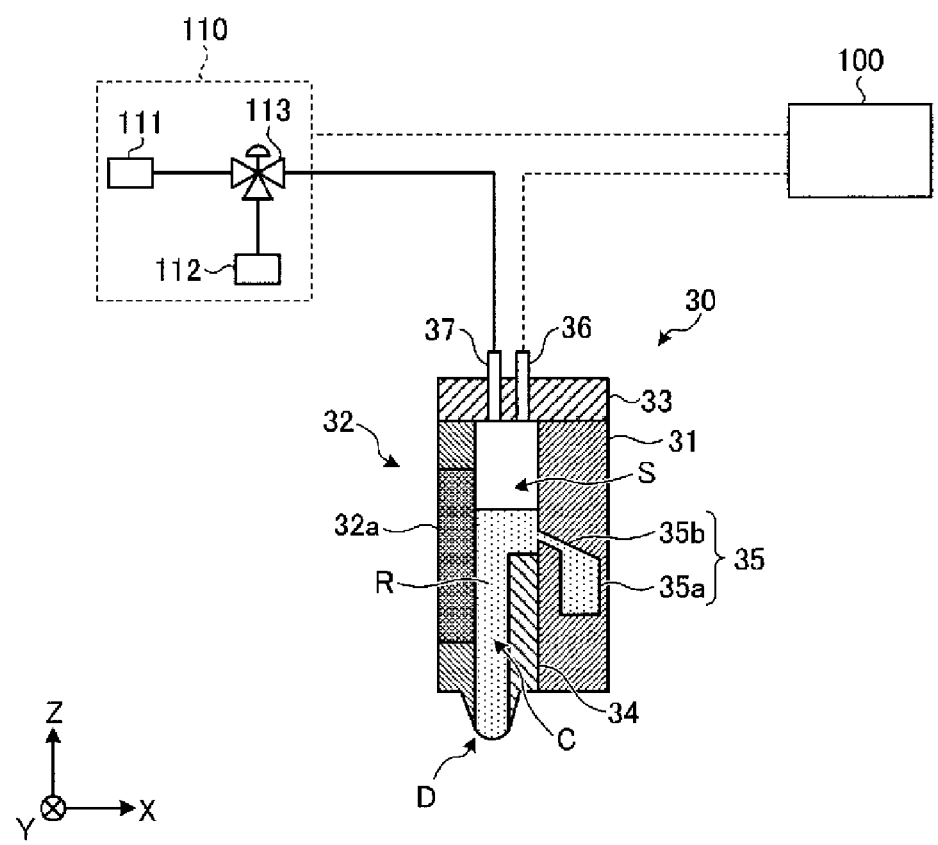
FIG. 5 is a view illustrating a connection relationship between devices used for pressure control and the nozzle.

Next, the actions of a coating processing are described. The coating apparatus 1 performs the coating processing of the coating liquid R on the substrate W while controlling the pressure inside an enclosed space surrounded by the liquid surface of the coating liquid R stored in the storage chamber S and inner wall surfaces of the storage chamber S. FIG. 5 is a schematic view illustrating a connection relationship between devices used for pressure control and the nozzle 30.

As illustrated in FIG. 5, a pressure measuring unit 36 measuring the pressure inside the enclosed space formed within the nozzle 30 and a pressure adjusting pipe 37 connected to a pressure adjusting unit 110 which adjusts the pressure inside the enclosed space pass through the cover 33 and are installed at the cover 33 of the nozzle 30, respectively. The pressure measuring unit 36 is electrically connected to a control device 100 and the measurement result is input to the control device 100.

Further, the pressure measuring unit 36 may be arranged in any way as long as communicating with the enclosed space within the nozzle 30, for example, may be installed to penetrate the first main body 31.

The pressure adjusting unit 110 is configured such that an exhausting unit 111 such as a vacuum pump and a gas supply source 112 supplying gas such as, $N_2$, are connected to the pressure adjusting pipe 37 through a switching valve 113. The pressure adjusting unit 110 is also electrically connected to the control device 100, and adjusts a degree of opening of the switching valve 113 according to an instruction from the control device 100 to connect one of the gas supply source 112 and the exhausting unit 111 to the pressure adjusting pipe 37, so the exhaust amount from the inside of the storage chamber S or the amount of gas to be supplied into the storage chamber S may be adjusted. Accordingly, the coating apparatus 1 is able to adjust the measurement result of the pressure measuring unit 36, that is, the pressure inside the storage chamber S to become a predetermined value.

In this case, the inside of the storage chamber S may be exhausted to make the pressure inside the storage chamber S lower than outside the storage chamber S to pull up the coating liquid R within the storage chamber S upwardly, thereby preventing the coating liquid R from being dropped out from the discharge port D. Further, gas may be supplied into the storage chamber S to pressurize the coating liquid R remaining within storage chamber S after the coating liquid R is coated, so that the coating liquid R may be extruded or purged.

Further, the configuration of the pressure adjusting unit 110 is not limited to the present exemplary embodiment and the configuration may be arbitrarily set as long as the pressure inside the storage chamber S may be controlled. For example, the pressure adjusting pipe 37 and the pressure adjusting valve may be installed at the exhausting unit 111 and the gas supply source 112, respectively, and connected to the cover 33 separately.

Figure 6:
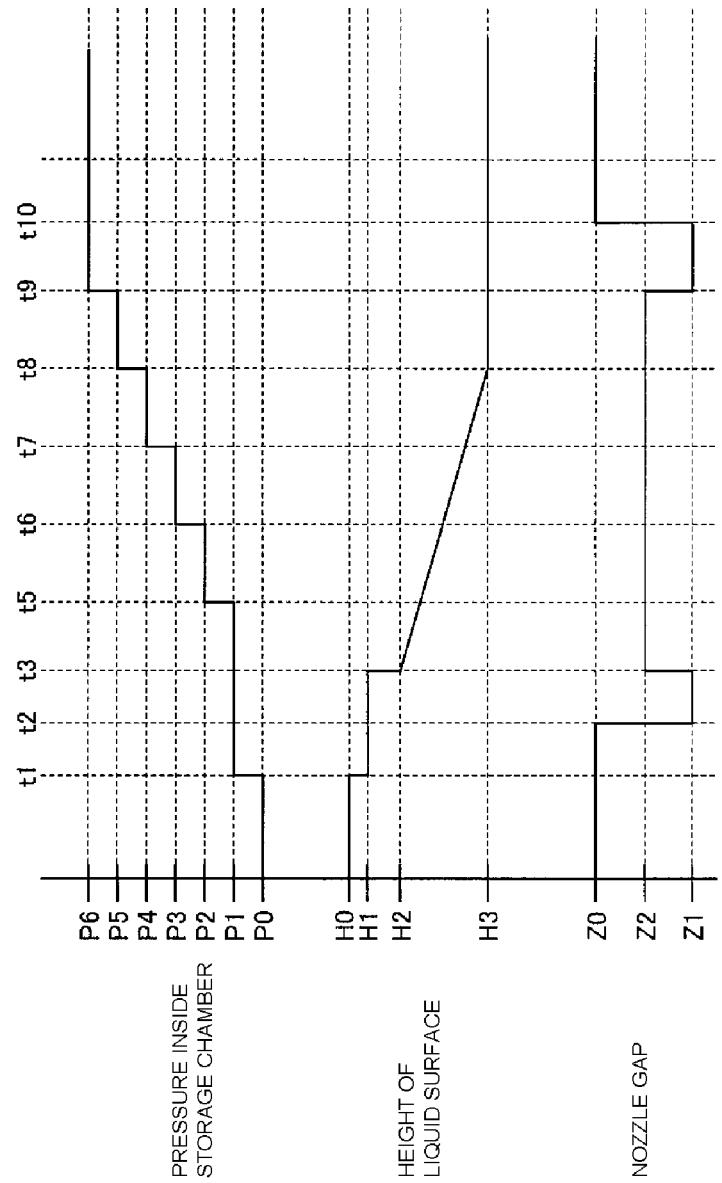
FIG. 6 is a timing chart illustrating a state change of each device in coating processing.
Figure 7A:
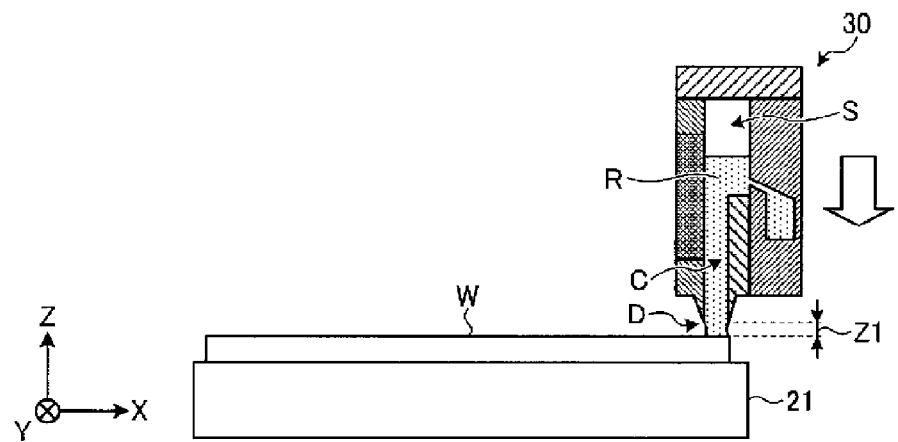
FIG. 7A is a schematic view illustrating an aspect of a coating processing.
Figure 7B:
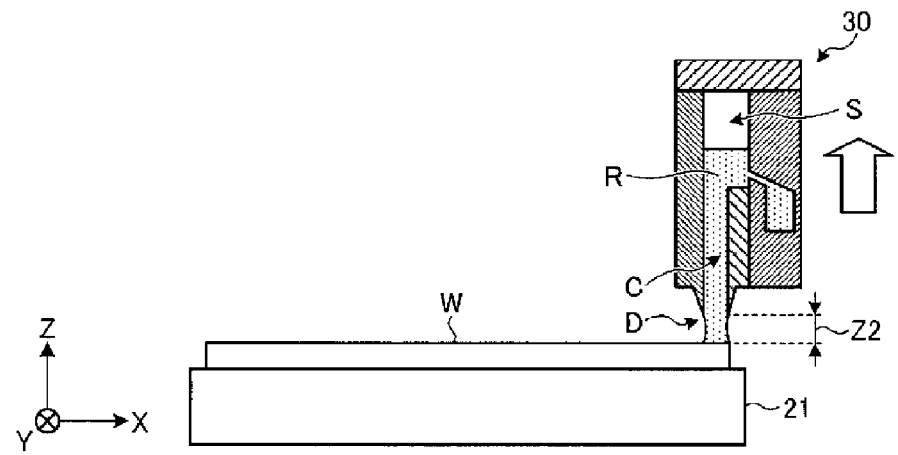
FIG. 7B is a schematic view illustrating another aspect of the coating processing.
Figure 7C:
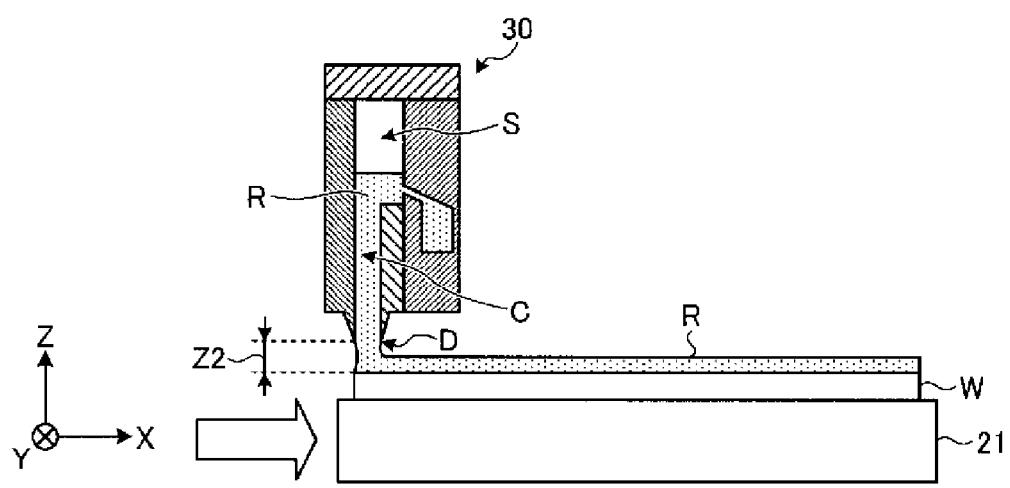
FIG. 7C is a schematic view illustrating still another view of the coating processing.

Next, the operations upon when the coating processing is performed will be described with reference to FIG. 6, and FIGS. 7A to 7C. FIG. 6 is a timing chart view illustrating a state change of each device in the coating processing. Further, FIGS. 7A to 7C are schematic views illustrating situations at the time of the coating processing.

Further, in the following description, the pressure which is lower than that outside the storage chamber S is referred to as "negative pressure". Further, in a case where the negative pressure is changed, for example, the negative pressure is changed such that the absolute value thereof is increased, for example, changed from "400 Pa" to "−450 Pa", it will be referred to as "pressure is reduced" or "vacuum level is increased".

Further, it is assumed that the nozzle 30 is filled with the coating liquid R. The amount of the coating liquid R filled into the nozzle 30 may be an amount that allows the front surface of the substrate W to be coated at least once.

Further, in the coating liquid filling processing to be described below (see step S101 of FIG. 8), the pressure inside the storage chamber S is adjusted to a predetermined value P0 (see FIG. 6) until the next coating processing (see step S108 of FIG. 8) is started after the nozzle 30 is filled with the coating liquid R. Therefore, the coating liquid R is maintained within the nozzle 30 without being dropped out from the discharge port D until the coating processing is started. Further, the predetermined value P0 is a negative pressure (e.g., −450 Pa) lower than the pressure outside the storage chamber S (atmospheric pressure).

When the coating processing is started, the coating apparatus 1 adjusts the pressure inside the storage chamber S to a predetermined value P1 (e.g., −440 Pa) higher than the P0 using the pressure adjusting unit 110 (see time t1 of FIG. 6). Accordingly, the gravity applied to the coating liquid R is slightly higher than the surface tension of the coating liquid R and the negative pressure inside the storage chamber S, and the coating liquid R maintained in the nozzle 30 is exposed from the discharge port D. By doing this, the height of the liquid surface of the coating liquid R stored within the storage chamber S is reduced from H0 to H1.

Subsequently, the coating apparatus 1 causes the nozzle 30 to descend by using the elevation mechanism 40 (see FIG. 1) to set the distance between the discharge port D and the substrate W (hereinafter, referred to as "nozzle gap") to a predetermined distance Z1 (see time t2 of FIG. 6), as illustrated in FIG. 7A. Accordingly, the coating liquid R exposed from the discharge port D is contacted with the front surface of the substrate W.

Figure 8:
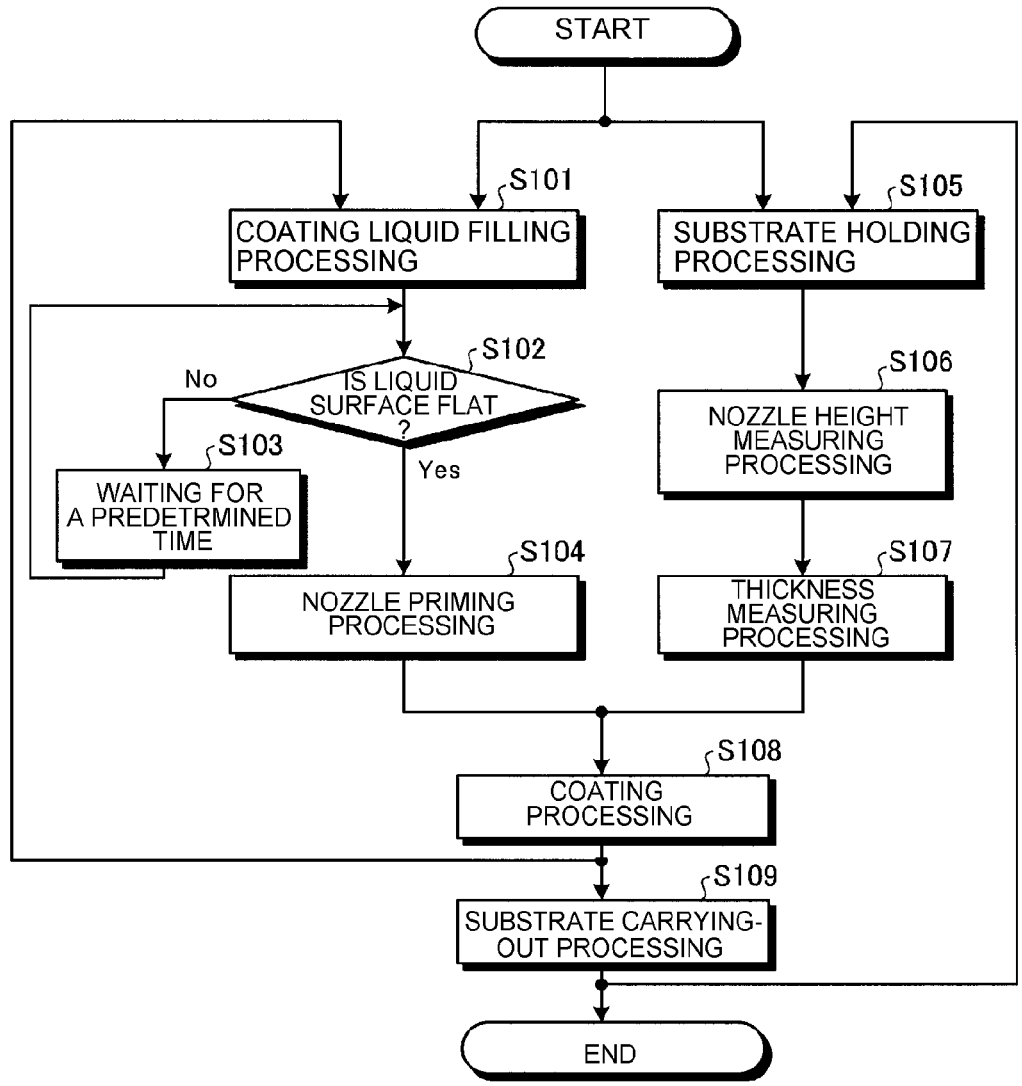
FIG. 8 is a flowchart illustrating a processing procedure for a substrate processing performed by a coating apparatus.

Further, the nozzle gap Z0 is calculated based on the distance to the front surface of the substrate W obtained by a thickness measurement processing (see step S107 of FIG. 8). Further, the nozzle gap Z1 is a value preset by, such as, a test.

Subsequently, the coating apparatus 1 causes the nozzle 30 to ascend to set the nozzle gap to Z2 (>Z1) (see time t3 of FIG. 6). Accordingly, the coating liquid R exposed from the discharge port D extends upwardly while being contacted with the front surface of the substrate W, as illustrated in FIG. 7B. Further, by doing this, the height of the coating liquid R stored within the storage chamber S is reduced from H1 to H2. Further, the nozzle gap Z2 is set depending on the film thickness of the coating film to be formed on the substrate W.

Thereafter, the coating apparatus 1 moves the substrate W at a predetermined speed using the first moving mechanism 20 (see FIG. 1) to a position where an end portion located at the negative direction of the X-axis of the substrate W is disposed directly below the nozzle 30. Accordingly, as illustrated in FIG. 7C, the coating liquid R of the storage chamber S is spilled out from the discharge port D and the coating liquid R is coated on the front surface of the substrate W.

Here, as described above, the nozzle 30 according to the first embodiment has a shape in which the flow resistance at the central portion in the longitudinal direction is larger than the flow resistance at both end portions in the longitudinal direction. Therefore, it is possible to mitigate a phenomenon that the film thickness T1 at both end portions in the longitudinal direction of the nozzle 30 becomes thinner than the film thickness T2 at the central portion in the longitudinal direction (see FIG. 2B). Accordingly, the coating apparatus 1 may suppress the deterioration of the film thickness uniformity in a direction (longitudinal direction of the nozzle 30) perpendicular to the moving direction (scanning direction) of the substrate W.

Further, the coating apparatus 1 may adjust the pressure inside the storage chamber S using the pressure adjusting unit 110 to suppress the deterioration of the film thickness uniformity in the longitudinal direction as well as in the scanning direction of the nozzle 30.

Specifically, the coating apparatus 1 increases the pressure inside the storage chamber S stepwise from P2 (e.g., −430 Pa) to P5 (e.g., −400 Pa) by the pressure adjusting unit 110 to be in conformity with the descent of the liquid surface of the coating liquid R within the storage chamber S (see time t5 to time t8 of FIG. 6).

When the liquid surface of the coating liquid R within the storage chamber S descends, the head pressure by the coating liquid R applied to the discharge port D is reduced. In this case, if the pressure inside the storage chamber S and the pressure outside the storage chamber S are not changed and maintained at a constant level, a force extruding out the coating liquid R from the discharge port D by the decrement in head pressure is reduced and thus, the discharge amount of the coating liquid R is reduced.

Accordingly, in the present exemplary embodiment, the pressure inside the storage chamber S is increased to the value P5 (−400 Pa) stepwise according to the descent of the height of the liquid surface of the coating liquid R within the storage chamber S, such that the decrement in head pressure in the discharge port D caused by the reduction of the liquid surface may be compensated. As a result, the discharge amount of the coating liquid R may be consistently maintained to form a coating film having a uniform film thickness in the plane of the substrate W.

The adjustment of the pressure inside the storage chamber S may be performed according to, for example, a relative moving distance between the nozzle 30 and the substrate W. In this case, the correlation between a moving distance of the nozzle 30 and a set value of pressure inside the storage chamber S is acquired in advance and the pressure inside the storage chamber S is adjusted based on the correlation. Such a correlation is acquired in advance to calculate decrement in the head pressure due to the consumption of the coating liquid R at a predetermined position in the substrate W of the nozzle 30 and accordingly the pressure inside the storage chamber S may be adjusted.

Further, the adjustment of the pressure inside the storage chamber S may be performed according to the height of the liquid surface of the coating liquid R within the storage chamber S. In this case, the value of the pressure inside the storage chamber S to be increased by the pressure adjusting unit 110 may be obtained based on, for example, the height of the liquid surface of the coating liquid R detected by the liquid surface detecting unit 160 to be described below (see FIG. 9).

Specifically, a difference between the height of the liquid surface of the coating liquid R in a state where the coating is not started and the height of the liquid surface of the coating liquid R in a state where the coating is started is calculated. Also, the decrement in head pressure applied to the discharge port D may be calculated by multiplying such a difference by the density of the coating liquid R. Therefore, the pressure inside the storage chamber S is increased by the decrement in head pressure by the pressure adjusting unit 110 and thus, the head pressure applied to the discharge port D becomes constant. Accordingly, the discharge amount of the coating liquid R from the discharge port D becomes constant and thus, a coating film having a uniform film thickness may be formed in the plane of the substrate W.

Further, for example, it may be considered that other pressure measuring mechanism is installed on the flow path C, the head pressure applied to the coating liquid R of the flow path C is directly calculated and the pressure inside the storage chamber S is adjusted by the pressure adjusting unit 110 to order to make the head pressure constant.

In any case, since the pressure inside the storage chamber S is adjusted such that the discharge amount of the coating liquid R from the discharge port D by the pressure adjusting unit 110, in other words, the head pressure of the discharge port D applied to the coating liquid R becomes constant, a coating film having a uniform film thickness may be formed in a plane of the substrate W.

In this way, the coating apparatus 1 controls the pressure adjusting unit 110 to adjust the pressure inside the storage chamber S such that the discharge amount of the coating liquid R becomes constant according to the control by the control device 100 while the coating liquid R is coated on the substrate W. Accordingly, the coating apparatus 1 may suppress deterioration of the film thickness uniformity in the longitudinal direction as well as in the scanning direction of the nozzle 30.

Further, the coating apparatus 1 may adjust the pressure inside the storage chamber S to maintain the coating liquid R against the gravity applied to the coating liquid or control the discharge amount of the coating liquid R with respect to the substrate W. Therefore, the liquid may be suppressed from being flown down or the film thickness may be suppressed from being degraded at the time of coating even when the width of the discharge port is widened in order to handle the coating liquid having a high viscosity of, for example, about several thousands cP. That is, the coating liquid having a high viscosity can be uniformly coated on the substrate W without being wasted.

When the end portion located at the negative direction of the X-axis of the substrate W is moved to a position directly below the nozzle 30, the coating apparatus 1 moves down the nozzle 30 to cause the discharge port D and the substrate W to come close to a distance Z1 (see time t9 of FIG. 6). Additionally, the coating apparatus 1 increases the pressure inside the storage chamber S to a value P6 (e.g., −390 Pa) by the pressure adjusting unit 110 to prevent coating defects from occurring when the coating liquid R previously coated on the substrate W is introduced into the storage chamber S.

Thereafter, the coating apparatus 1 moves up the nozzle 30 to the nozzle gap Z0 (see time t10 of FIG. 6). Accordingly, the supplying of the coating liquid R from the discharge port D to the substrate W is stopped, and the coating processing ends.

With reference to FIGS. 3A to 3C again, a remaining configuration of the nozzle 30 will be described. A portion of the second main body 32 is formed with a transparent member 32*a*. Accordingly, the coating liquid R stored in the storage chamber S is visible through the transparent member 32*a*. The coating apparatus 1 detects a position of the liquid surface of the coating liquid R within the storage chamber S through the transparent member 32*a* from the outside of the nozzle 30. This will be described below.

Further, the nozzle 30 includes a temporal storage unit 35 configured to temporarily store the coating liquid R filled in the storage chamber S within the first main body 31.

The temporal storage unit 35 includes a temporal storage chamber 35*a* configured to temporarily store the coating liquid R and a passage 35*b* configured to communicate the temporal storage chamber 35*a* with the storage chamber S. The temporal storage unit 35*a* is an elongated space having substantially the same length as that of the storage chamber S. Further, the passage 35*b* is a passage which extends obliquely upwardly from an upper part of the temporal storage chamber 35*a* towards the storage chamber S and has a slit shape extending along the longitudinal direction of the flow path C. Further, the nozzle 30 may not include the temporal storage unit 35.

Next, descriptions will be made on a processing process of a substrate processing including the coating processing described above. FIG. 8 is a flowchart illustrating a processing process for a substrate processing performed by the coating apparatus 1. Further, the coating apparatus 1 performs each processing illustrated in FIG. 8 based on a control by the control device 100. A control unit provided in the control device 100 corresponds to an example of a pressure control unit and a coating processing control unit in the present application.

Here, the processings of step S101 to step S109 illustrated in FIG. 8 are repeated until the substrate processing processes are completed for all the plurality of the substrates included in a lot. Further, when the substrate processing process for a single lot is completed, the substrate processing process for a next lot is started, but a nozzle cleaning processing which cleans the front end portion of the nozzle 30 is performed before the substrate processing process for the next lot is started. Such a nozzle cleaning processing will be described below.

As illustrated in FIG. 8, the coating apparatus 1 performs the processings of step S101 to step S104 and the processings of step S105 to step S107 concurrently, and performs the coating processing described above (step S108) after completing the processings of step S104 and step S107. First, the processings of step S101 to step S104 will be described.

In the processings of step S101 to step S104, the coating apparatus 1 performs the coating liquid filling processing first (step S101). In the coating liquid filling processing at step S101, the coating apparatus 1 moves the nozzle stand-by unit 80 to a position directly below the nozzle 30 first and then moves down the nozzle 30 to be disposed in the nozzle stand-by unit 80. Also, the coating apparatus 1 fills the coating liquid in the nozzle 30 in a state where the nozzle 30 is disposed in the nozzle stand-by unit 80.

Figure 9:
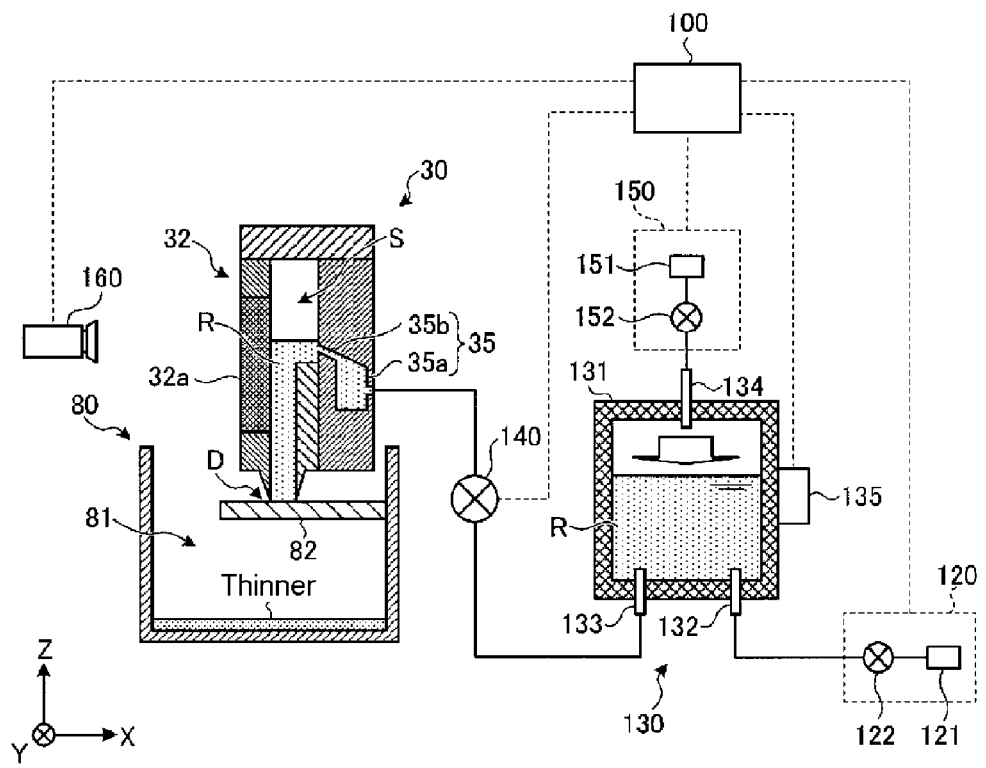
FIG. 9 is a view illustrating a connection relationship between devices used for a coating liquid filling processing and the nozzle.
Figure 10:
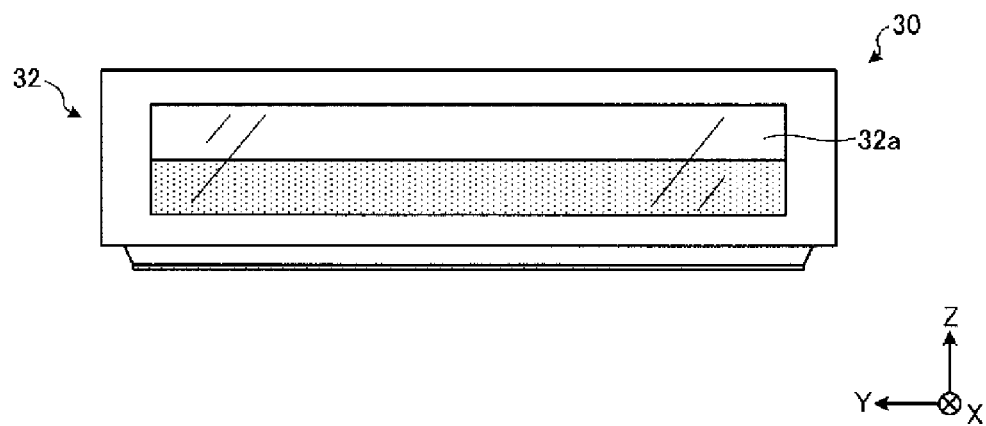
FIG. 10 is a schematic front view of the nozzle.
Figure 11:
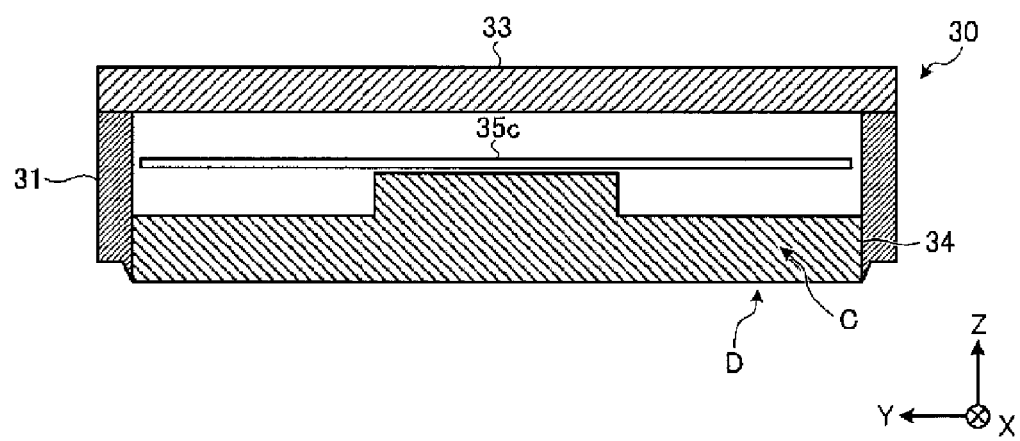
FIG. 11 is a schematic cross-sectional view illustrating a configuration of a liquid supply port.

Here, the contents of the coating liquid filling processing will be described. FIG. 9 is a schematic view illustrating a connection relationship between devices used for coating liquid filling processing and the nozzle. Further, FIG. 10 is a schematic front view of the nozzle and FIG. 11 is a schematic vertical cross-sectional view illustrating a configuration of the liquid supply port.

As illustrated in FIG. 9, the nozzle stand-by unit 80 has a receiving space 81 in which the nozzle 30 can be received. Thinner is stored in the accommodating space 81 and volatilizes to cause the inside of the accommodating space 81 to maintain at a thinner atmosphere.

Further, a substantially flat contact member 82 extending in the longitudinal direction (Y-axis) of the discharge port D of the nozzle 30 is installed in the receiving space 81. The contact member 82 is made of a resin material having chemical resistance such as, for example, rubber.

The coating apparatus 1 moves down the nozzle 30 toward the accommodating space 81 of the nozzle stand-by unit 80 to be contacted with the front end surface of the nozzle 30 to the contact member 82. Accordingly, the discharge port D becomes in a blocked state by the contact member 82. The coating apparatus 1 fills the coating liquid R in the nozzle 30 while the discharge port D is in the blocked state and thus, the coating liquid may be prevented from leaking out from the discharge port D during the filling of the coating liquid R. In particular, in a case where the nozzle 30 is filled with the coating liquid R from the empty state, the coating liquid may be efficiently prevented from leaking out from the discharge port D.

In the meantime, the coating apparatus 1 further includes a coating liquid supplying unit 120, an intermediate tank 130, a supply pump 140, a pressurizing unit 150, and a liquid surface detecting unit 160

The coating liquid supplying unit 120 includes a coating liquid supply source 121 and a valve 122. The coating liquid supply source 121 is connected to the intermediate tank 130 through the valve 122 and supplies the intermediate tank 130 with the coating liquid R. Further, the coating liquid supplying unit 120 is electrically connected to the control device 100 and the opening/closing of the valve 122 is controlled by the control device 100.

The intermediate tank 130 is interposed between the coating liquid supplying unit 120 and the nozzle 30. The intermediate tank 130 includes a tank unit 131, a first supply pipe 132, a second supply pipe 133, a third supply pipe 134, and a liquid surface sensor 135.

The tank unit 131 stores the coating liquid R. The first supply pipe 132 and the second supply pipe 133 are installed at the bottom of the tank unit 131. The first supply pipe 132 is connected to the coating liquid supply source 121 through the valve 122 and the second supply pipe 133 is connected to the temporal storage chamber 35a of the nozzle 30 through the supply pump 140.

Further, when the temporal storage unit 35 is not provided in the nozzle 30, a communicating port configured to communicate the storage chamber S with the outside of the storage chamber S may be installed at the nozzle 30, and the second supply pipe 133 may be connected to the communicating port to directly supply the storage chamber S with the coating liquid R.

The pressurizing unit 150 is connected to the third supply pipe 134. The pressurizing unit 150 includes a gas supply source 151 that supplies gas such as, $N_2$ and a valve 152a, and supplies the gas into the tank unit 131 to pressurize the inside of the tank unit 131. The pressurizing unit 150 is electrically connected to the control device 100 and the opening/closing of the valve 122 is controlled by the control device 100.

Further, the liquid surface sensor 135 is a detecting unit configured to detect the liquid surface of the coating liquid R stored in the tank unit 131. The liquid surface sensor 135 is electrically connected to the control device 100 and the detection result is input to the control device 100.

The supply pump 140 is installed in the middle of the second supply pipe 133 and supplies the nozzle 30 with the coating liquid R supplied from the intermediate tank 130 by a predetermined amount of the coating liquid R per each time. The supply pump 140 is electrically connected to the control device 100 and a supplying amount of the coating liquid R to the nozzle 30 is controlled by the control device 100.

The liquid surface detecting unit 160 is disposed in front of the nozzle 30 and detects a position of the liquid surface (hereinafter, referred to as "height of the liquid surface") of the coating liquid R stored in the storage chamber S. Here, as illustrated in FIG. 10, a portion of the second main body 32 forming the front surface portion of the nozzle 30 is formed with the transparent member 32a and thus, the coating liquid R stored in the storage chamber S is visible through the transparent member 32a. The liquid surface detecting unit 160 is, for example, a CCD (Charge Coupled Device) camera and takes a photograph of the inside of the storage chamber S through transparent member 32a from the front side of the nozzle 30 to detect the position of the liquid surface of the coating liquid R. The detection result by the liquid surface detecting unit 160 is input to the control device 100. Accordingly, the coating apparatus 1 may easily detect the height of the liquid surface of the coating liquid R.

Next, operations of the coating apparatus 1 at the time of the coating liquid filling processing will be described. The coating apparatus 1 determines the amount of the coating liquid R (hereinafter, referred to as "target amount") to be filled in the nozzle 30 based on the detection result. Also, the coating apparatus 1 operates the supply pump 140 to supply the coating liquid R by a target amount to the temporal storage chamber 35a from the intermediate tank 130d.

Figure 12:
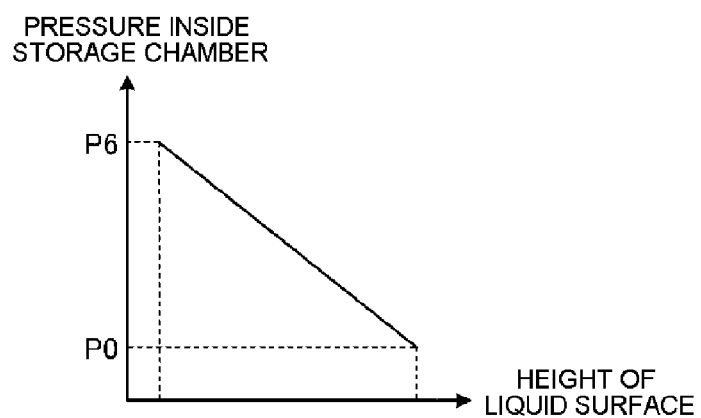
FIG. 12 is a view illustrating the contents of pressure control at the time of a coating liquid filling processing.

In this case, the coating apparatus 1 supplies the storage chamber S with the coating liquid R while adjusting the pressure inside the storage chamber S using the pressure adjusting unit 110 (see FIG. 5). Here, the contents of the pressure control at the time of the coating liquid filling processing will be described with reference to FIG. 12. FIG. 12 is a view illustrating the contents of the pressure control at the time of the coating liquid filling processing.

The pressure inside the storage chamber S is adjusted to a negative pressure at the time of coating liquid filling processing. Accordingly, the coating liquid R remaining in the storage chamber S may be prevented from leaking out from the discharge port D.

Also, as illustrated in FIG. 12, the coating apparatus 1 supplies the coating liquid R, while gradually reducing the pressure inside the storage chamber S which is adjusted to the negative pressure (that is, increases the vacuum level) according to the height of the liquid surface of the storage chamber S detected by the liquid surface detecting unit 160.

Specifically, the pressure inside the storage chamber S at the time of starting the coating liquid filling processing is also P6 (e.g., −390 Pa) which is the same as that at the time of completing the coating processing. In the meantime, the pressure inside the storage chamber S at the time of completing the coating liquid filling processing is adjusted to the pressure P0 (e.g., −450 Pa) corresponding to the pressure before the coating liquid filling processing is started. Also, the coating apparatus 1 changes the pressure to a pressure value ranging from P6 to P0 according to the height of the liquid surface of the storage chamber S.

As described above, the coating apparatus 1 controls the pressure adjusting unit 110 to cause the pressure inside of the storage chamber S to be the negative pressure, and further supplies the coating liquid R into the storage chamber S while gradually reducing the pressure inside the storage chamber S.

When the storage chamber S is filled with the coating liquid R and the liquid surface of the coating liquid R within the coating liquid R is increased, the head pressure by the coating liquid R applied to the discharge port D is increased. In this case, in a case where the pressure inside the storage chamber S and the pressure outside the storage chamber S are not changed and remain constant, the force pushing the coating liquid R upwardly becomes relatively weak by an increment in head pressure, so that the coating liquid R becomes easy to leak out from the discharge port D.

In contrast to this, in the present exemplary embodiment, the pressure inside the storage chamber S is gradually reduced by the pressure adjusting unit 110 in conformity with the increase of the height of the liquid surface of the coating liquid R within the storage chamber S to supplement the force pushing the coating liquid R upwardly. By doing this, the coating liquid R may be reliably suppressed from leaking out from the discharge port D during the coating liquid filling processing.

Further, the coating apparatus 1 controls the pressure adjusting unit 110 to maintain the pressure inside the storage chamber S (that is, P0) at the time of completing the supplying of the coating liquid R into the storage chamber S until the coating processing is started after the supplying of the coating liquid R into the storage chamber S is completed. Therefore, the controlling of the pressure inside the storage chamber S may be efficiently performed in a series of the substrate processings.

Further, here, the pressure is changed according to the height of the liquid surface, but the change of pressure is not limited thereto, and for example, the pressure may be changed, according to a predetermined time.

Further, the coating apparatus 1 supplies the coating liquid R to the nozzle 30, for example, from the intermediate tank 130 installed between the coating liquid supply source 121 and the nozzle 30 rather than supplying the coating liquid R directly from the coating liquid supply source 121. Accordingly, a piping distance to the nozzle 30 may be shortened and thus, the coating liquid R may be easily supplied from the intermediate tank 130 to the nozzle 30 even when, for example, the supply of the coating liquid R from the coating liquid supply source 121 is difficult due to the high viscosity of the coating liquid R.

Further, even when it is also difficult to supply the coating liquid R from the intermediate tank 130 to the nozzle 30, the coating apparatus 1 increases the pressure inside the tank unit 131 using the pressurizing unit 150 and thus, the coating liquid R may be supplied from the intermediate tank 130 to the nozzle 30.

The coating liquid R is supplied from the intermediate tank 130 to the temporal storage chamber 35a of the nozzle 30 and then supplied to the storage chamber S through a passage 35b. Here, as illustrated in FIG. 11, a slit-like liquid supply port 35c communicated with the storage chamber S and extending along the longitudinal direction of the flow path C is formed at the front end portion of the passage 35b. Accordingly, the coating apparatus 1 may uniformly supply the coating liquid R along the longitudinal direction of the storage chamber S. Therefore, a height deviation of the coating liquid R may not occur within the storage chamber S, for example, as compared with a case where the coating liquid R is supplied from a side portion of the nozzle 30.

Further, the liquid supply port 35c is disposed in the vicinity of the boundary portion between the land 34 (the flow path C) and the storage chamber S, specifically, slightly above the land 34 (the flow path C). As described above, by supplying the coating liquid R is supplied from as low a portion of the storage chamber S as possible, bubbles may be suppressed from being mixed into the coating liquid R when the storage chamber S is filled with the coating liquid R.

Further, when it is determined that the amount of the coating liquid R stored in the tank unit 131 becomes lower than a predetermined amount based on the detection result of the liquid surface detecting unit 160, the coating apparatus 1 controls the coating liquid supplying unit 120 to supply the coating liquid R from the coating liquid supply source 121 to the tank unit 131. Accordingly, the tank unit 131 is supplemented with the coating liquid R.

Returning to FIG. 8, descriptions on the substrate processing will be continued. When the coating liquid filling processing of step S101 is completed, the coating apparatus 1 determines whether the liquid surface of the coating liquid R filled within the storage chamber S is flat based on the detection result of the liquid surface detecting unit 160 (step S102). For example, the coating apparatus 1 calculates a difference between the highest position of the liquid surface and the lowest position of the liquid surface. When the obtained difference falls within a predetermined range, the coating apparatus 1 determines that the liquid surface is flat.

In such a processing, when it is determined that the liquid surface is not flat ("NO" at step S102), the coating apparatus 1 waits for a predetermined time (step S103), and then, performs the determination at step S102 again. The coating apparatus 1 repeats the processings of step S102 and step S103 until the liquid surface becomes flat. When it is determined that the liquid surface is flat ("YES" at step S102), the processing process proceeds to a nozzle priming processing of step S104.

As described above, the coating apparatus 1 determines whether the liquid surface becomes flat based on the detection result of the liquid surface detecting unit 160. Also, when it is determined that the liquid surface is flat, the coating apparatus 1 starts the coating processing using the nozzle 30, so that the deterioration of the film thickness uniformity may be suppressed. That is, in a case where the liquid surface is not flat, in other words, when there is a height deviation in the liquid surface of the coating liquid R within the storage chamber S, the head pressure applied to the discharge port D of the nozzle 30 becomes uneven. Therefore, there is a concern that the film thickness uniformity is deteriorated. Accordingly, as in the present exemplary embodiment, the coating processing is started after the liquid surface becomes flat and thus, the deterioration of the film thickness uniformity may be suppressed.

Subsequently, the nozzle priming processing of step S104 will be described. The nozzle priming processing is a processing in which the front end of the nozzle 30 is wiped out using the nozzle cleaning unit 60 (see FIG. 1) to maintain a state of the discharge port D. When the nozzle priming processing is started, the coating apparatus 1 returns the substrate W to the initial position (position illustrated in FIG. 1) and moves the nozzle cleaning unit 60 directly below the nozzle 30 using the second moving mechanism 90. Also, the coating apparatus 1 wipes the coating liquid R exposed from the discharge port D using the nozzle cleaning unit 60 to maintain the state of the discharge port D.

Figure 13:
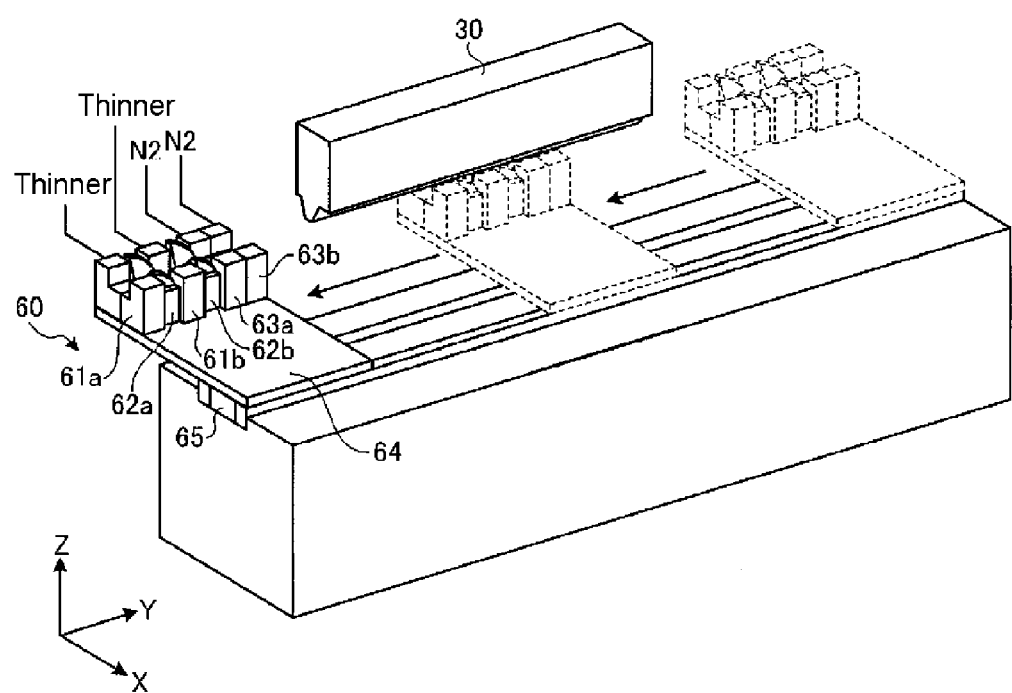
FIG. 13 is a schematic front view illustrating a configuration of a nozzle cleaning unit.

Here, the configuration of the nozzle cleaning unit 60 and the contents of the nozzle priming processing will be described with reference to FIG. 13. FIG. 13 is a schematic perspective view illustrating a configuration of the nozzle cleaning unit 60.

As illustrated in FIG. 13, the nozzle cleaning unit 60 includes thinner discharging units 61a, 61b, pads 62a, 62b, $N_2$ ejecting units 63a, 63b, a disposing unit 64, and a driving unit 65.

The thinner discharging units 61a, 61b are connected to a thinner supply source through, for example, a pump not illustrated, and discharge the thinner supplied from the thinner supply source from both sides in the width direction of the nozzle 30 towards the front end portion of the nozzle 30. Accordingly, the coating liquid adhered to the front end portion of the nozzle 30 may be dissolved.

The pads 62a, 62b are formed in an approximately V shape according to the shape of the front end portion of the nozzle 30 and contacted with both surfaces in the width direction of the front end portion of the nozzle 30. The pads 62a, 62b are moved by the driving unit 65 to be described below to cause the coating liquid adhered to the front end portion of the nozzle 30 to be wiped out by the pads 62a, 62b.

The $N_2$ ejecting units 63a, 63b are connected to a $N_2$ supply source through, for example, a pump not illustrated, and ejects $N_2$ supplied from the $N_2$ supply source from both sides of the nozzle 30 in the width direction towards the front end portion of the nozzle 30. Accordingly, the front end portion of the nozzle 30 is dried.

These thinner discharging units 61a, 61b, the pads 62a, 62b and the $N_2$ ejecting units 63a, 63b are disposed in the disposing unit 64. Specifically, the thinner discharging unit 61a, the pad 62a, the thinner discharging unit 61b, the pad 62b, the $N_2$ ejecting units 63a and the $N_2$ ejecting units 63b are disposed in this order in parallel to the nozzle 30 extension direction (Y-axis direction).

The driving unit 65 moves the disposing unit 64 in a direction parallel to the extension direction (Y-axis direction) of the nozzle 30 to cause the thinner discharging units 61a, 61b, the pads 62a, 62b and the $N_2$ ejecting units 63a, 63b disposed on the disposing unit 64 to move in parallel to the nozzle 30 extension direction.

When performing the nozzle priming processing, the coating apparatus 1 uses only the pads 62a, 62b among the thinner discharging units 61a, 61b, the pads 62a, 62b and the $N_2$ ejecting units 63a, 63b.

Specifically, the coating apparatus 1 moves the disposing unit 64 to the negative direction of the Y-axis using the driving unit 65 in a state where the nozzle 30 is lowered using the elevation mechanism 40 to be disposed at a position where the front end portion of the nozzle 30 is contacted with the pads 62a, 62b. Accordingly, the coating liquid R exposed from the discharge port D or the coating liquid R adhered to the front end portion of the nozzle 30 is wiped out by the pads 62a, 62b to maintain the state of the discharge port D.

After the nozzle priming processing described above is completed, the coating apparatus 1 starts the coating processing (step S108). As described above, the coating apparatus 1 starts the coating processing after the state of the discharge port D is maintained by the nozzle priming processing and thus, the film thickness uniformity just after the coating processing is started may be enhanced. Further, the coating apparatus 1 performs the nozzle priming processing right before the coating processing is started and thus, the maintained state of the discharge port D may be easily kept.

Further, the thinner discharging units 61a, 61b and the $N_2$ ejecting units 63a, 63b included in the nozzle cleaning unit 60 are used at the time of nozzle cleaning processing performed between the lots. That is, in the nozzle cleaning processing, the coating apparatus 1 moves the disposing unit 64 in the negative direction of the Y-axis using the driving unit 6 in a state where the thinner is ejected from the thinner discharging units 61a, 61b and the $N_2$ is ejected from the $N_2$ ejecting units 63a, 63b. Accordingly, the nozzle cleaning unit 60 supplies the thinner by the thinner discharging unit 61a, wipes the thinner by the pad 62a, supplies the thinner by the thinner discharging unit 61b, wipes the thinner by the pad 62b, and ejects $N_2$ by the $N_2$ ejecting units 63a, 63b with respect to the front end portion of the nozzle 30 to clean the nozzle 30.

Subsequently, the processings of step S105 to S107 will be described. The coating apparatus 1 absorbs and holds the substrate W disposed on a top surface of the substrate holding unit 21 using the substrate holding unit 21 (step S105) and then, performs the nozzle height measuring processing (step S106). In such a nozzle height measuring processing, the coating apparatus 1 measures a distance to the lower end surface of the nozzle 30 using the nozzle height measuring unit 50b to determine whether the nozzle 30 is placed at a preset height. In such a processing, when the height of the nozzle is deviated from the preset height, the coating apparatus 1 may perform correction for the height of nozzle using the moving unit 412.

Further, it does not matter if such a nozzle height measuring processing is performed before step S105. Further, the nozzle height measuring processing may be performed with respect to any one (for example, first processing) of the substrate processings repeatedly performed for each lot.

Subsequently, the coating apparatus 1 performs a thickness measuring processing (step S107). Specifically, the coating apparatus 1 moves the substrate W held on the substrate holding unit 21 to a position below the thickness measuring unit 50a using the driving unit 22 and then, measures a distance to the top surface of the substrate W using the thickness measuring unit 50a. The measurement result by the thickness measuring unit 50a is transmitted to the control device 100.

Further, the outer peripheral surface of the substrate W is likely to be in a roughened state due to the respective processes performed until the substrate W is delivered to the coating apparatus. Accordingly, it is preferable to set a position spaced inwardly apart from the outer periphery of the substrate W by a predetermined distance (for example, about 2 mm) as a measurement point.

Further, the coating apparatus 1 includes a plurality of the thickness measuring units 50a (for example, two units), and determines a value (for example, a mean value) based on the measurement results obtained by each thickness measuring unit 50a as a distance to the top surface of the substrate W.

When completing the thickness measuring processing, the coating apparatus 1 moves the substrate W to a coating processing starting position (the position at which an end portion in positive direction of the X-axis of the substrate W is disposed directly below the nozzle 30). Also, when the nozzle priming processing of step S104 is completed, the coating apparatus 1 performs the coating processing immediately. Otherwise, when the nozzle priming processing of step S104 is not completed, the coating apparatus 1 performs the coating processing immediately after the completion of the nozzle priming processing (step S108). The contents of the coating processing are described above and thus, the description thereof will be omitted here.

When completing the processing of step S108, the processing process is returned to step S101, and the coating apparatus 1 performs the processings of step S101 to S104. Further, the coating apparatus 1 performs again the processings of step S105 to S107 in parallel with the processings of step S101 to S104, after performing the substrate carrying out processing (step 109). Further, the substrate carrying out processing is a processing in which the substrate W subjected to the substrate processing is delivered to an external device after releasing the suction and holding of the substrate W by the substrate holding unit 21.

When completing the processings of step S101 to step S109 described above with respect to all the substrates W included in one lot, the coating apparatus 1 ends a series of the substrate processings for one lot.

As described above, the coating apparatus according to the first embodiment includes a nozzle and a moving mechanism. The nozzle includes the storage chamber that stores a coating liquid and a slit-like flow path in communication with the storage chamber, and discharges the coating liquid from the discharge port formed at the front end of the flow path. The moving mechanism moves the nozzle and the substrate relatively to each other along the surface of the substrate. Also, the nozzle has an elongated land which is formed in the flow path and of which the central portion in the longitudinal direction protrudes towards the storage chamber side. Accordingly, the coating apparatus according to the first embodiment may enhance the film thickness uniformity.

Further, in the first exemplary embodiment, the liquid surface detecting unit 160 is used to capture an image of the inside of the storage chamber S (see FIG. 9). However, since the storage chamber S has an elongated shape, the liquid surface detecting unit 160 needs to be disposed at a position spaced apart from the nozzle 30 by a predetermined distance in order to capture an image of the inside of the storage chamber S from one end to another end in the longitudinal direction of the storage chamber S. Therefore, a configuration for disposing the liquid surface detecting unit 160 in the vicinity of the nozzle 30 will be described with reference to FIGS. 14A and 14B and FIGS. 15A and 15B. FIGS. 14A and 14B and FIGS. 15A and 15B are schematic views illustrating other examples of the liquid surface detection method.

Figure 14A:
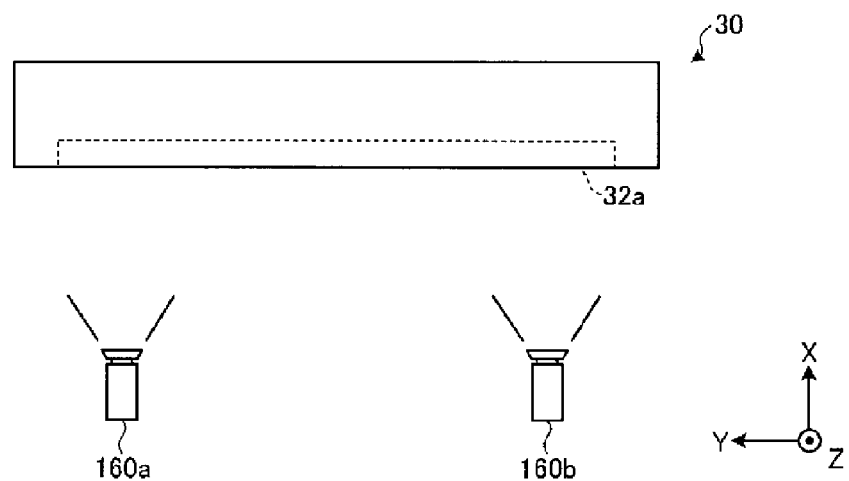
FIG. 14A is a schematic view illustrating an example of a liquid surface detection method.

For example, as illustrated in FIG. 14A, the coating apparatus 1 may include a plurality of the liquid surface detecting units (here, the liquid surface detecting units 160a, 160b) which detect the liquid surface of the coating liquid R from the front side of the nozzle 30. As such, the plurality of the liquid surface detecting units are installed such that a range to be detected by the liquid surface detecting unit can be reduced. Therefore, the liquid surface detecting unit may be disposed in the vicinity of the nozzle 30.

Figure 14B:
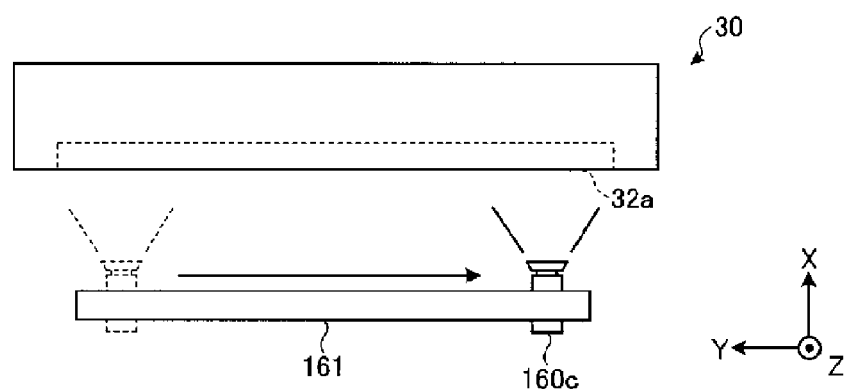
FIG. 14B is a schematic view illustrating another example of the liquid surface detection method.

Further, as illustrated in FIG. 14B, the coating apparatus 1 may include a single liquid surface detecting unit 160c and a driving unit 161 configured to move the liquid surface detecting unit 160c along the longitudinal direction (Y-axis direction) of the nozzle 30. By doing this, the liquid surface detecting unit may also be disposed in the vicinity of the nozzle 30.

Figure 15A:
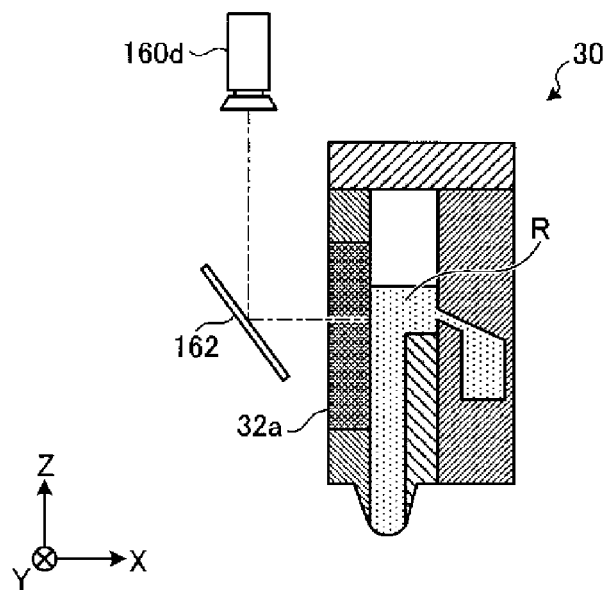
FIG. 15A is a schematic view illustrating another example of the liquid surface detection method.

Further, if it is intended that the liquid surface detecting unit is to be disposed at a location other than the front side of the nozzle 30, as illustrated in FIG. 15Aa, the liquid surface detecting unit 160d may be disposed above the nozzle 30 to be oriented downwardly to capture the image of the liquid surface of the coating liquid R through a prism 162 which reflects or refracts light.

As described above, the liquid surface detecting unit 60d may be disposed obliquely at a predetermined angle with respect to the liquid surface of the coating liquid R to capture the image of the liquid surface viewed from a direction approximately parallel to the liquid surface of the coating liquid R through the prism 162. Accordingly, the liquid surface detecting unit may be disposed at a location other than the front side of the nozzle 30.

Figure 15B:
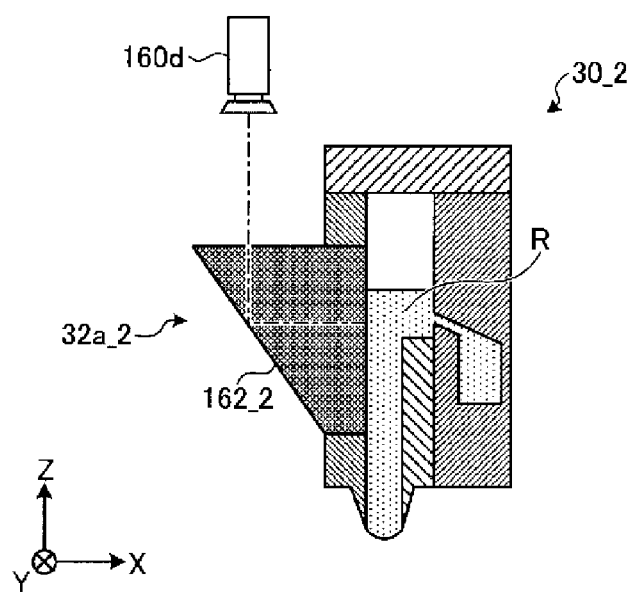
FIG. 15B is a schematic view illustrating another example of the liquid surface detection method.

Further, the prism may be formed integrally with the nozzle. For example, as illustrated in FIG. 15B, the nozzle 30_2 may include a transparent member 32a_2 installed with a prism 162_2 at the front portion thereof.

Further, here, an example in which the liquid surface detecting unit is an image capturing apparatus such as a CCD camera is described, but liquid surface detecting unit is not limited to an image capturing apparatus, but may include an optical sensor such as an infrared sensor.

Second Exemplary Embodiment

By the way, in the first exemplary embodiment as described above, the land provided in the nozzle is formed in a shape in which the central portion in the longitudinal direction of the land protrudes towards the storage chamber side such that the flow resistance at the central portion in the longitudinal direction is larger than that at both end portions in the longitudinal direction, thereby enhancing the film thickness uniformity. However, the method of enhancing the film thickness uniformity is not limited thereto.

For example, a flow gap (the distance between the land and the second main body) may be narrowed or widened according to the film thickness profile to change the flow resistance to enhance the film thickness uniformity. Hereinafter, these will be described with reference to FIG. 16A to FIG. 16C.

Figure 16A:
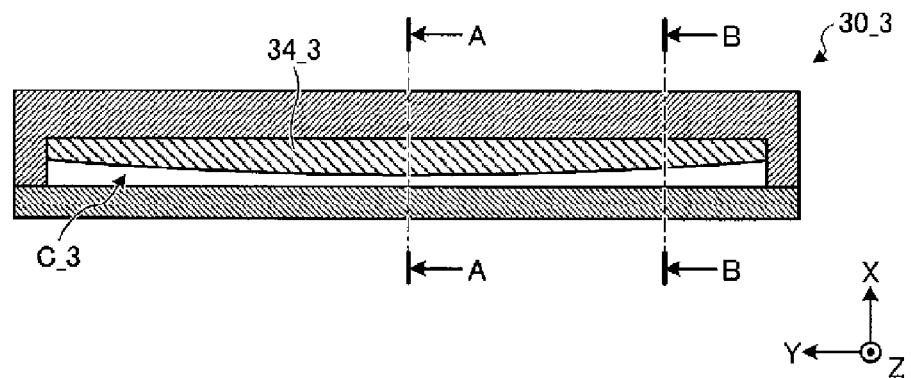
FIG. 16A is a schematic horizontal cross-sectional view illustrating another configuration of the nozzle.
Figure 16B:
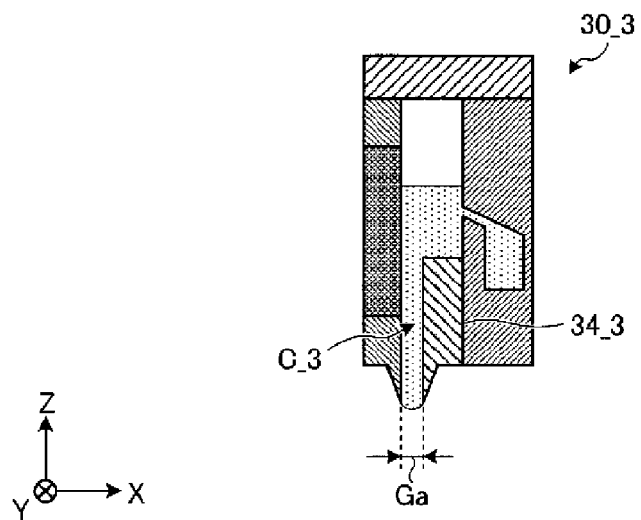
FIG. 16B is a cross-sectional view taken along line A-A in FIG. 16A.
Figure 16C:
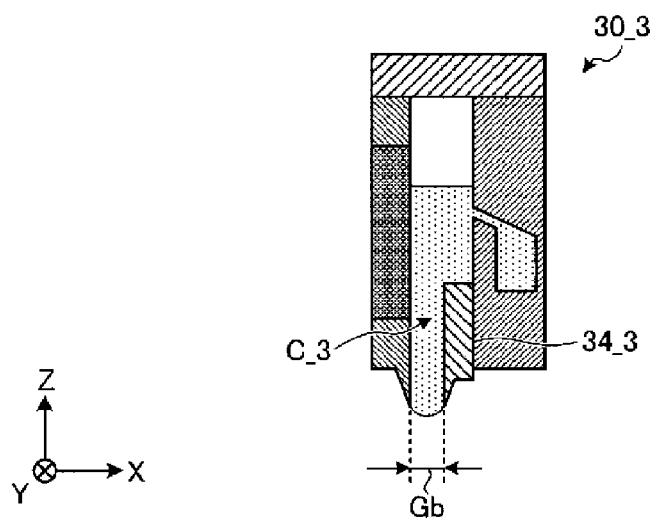
FIG. 16C is a cross-sectional view taken along line B-B in FIG. 16A.

FIG. 16A is a schematic horizontal cross-sectional view illustrating another configuration of the nozzle. Further, FIG. 16B is a schematic cross-sectional taken along line A-A in FIG. 16A and FIG. 16C is a cross-sectional view taken along line B-B in FIG. 16A.

As illustrated in FIG. 16A, a nozzle 30_3 according to the second exemplary embodiment is formed such that the thickness at the central portion in the longitudinal direction is thicker than that at both end portions in the longitudinal direction viewed in a plane view. Accordingly, as illustrated in FIGS. 16A and 16C, a gap Ga of a flow path C_3 at the central portion in the longitudinal direction becomes narrower than a gap Gb of the flow path C_3 in a nozzle 30_3 at both end portions in the longitudinal direction.

As a result, since the flow resistance at the central portion in the longitudinal direction becomes larger than that at both end portions in the longitudinal direction, the nozzle 30_3 according to the second exemplary embodiment may enhance the film thickness uniformity similarly to the first exemplary embodiment as described above.

Further, here, although the gap of the flow path C_3 is changed by changing the thickness of the land 34_3, the flow path gap may be changed by keeping the thickness of the land constant and changing the thickness of the second main body. Further, the flow path gap may be changed by changing both the thicknesses of the land and the second main body.

Further, here, although the flow resistance is changed by changing the flow path gap, the flow resistance may be changed, for example, by changing the material of the land or the second main body. For example, minute irregularity may be formed on the surface of the central portion opposed to the second main body in the longitudinal direction of the land so as to increase the flow resistance at the central portion in the longitudinal direction higher than that at both end portions in the longitudinal direction.

Further, in each exemplary embodiment described above, although it is exemplified that the substrate is moved in the horizontal direction to coat the coating liquid on the top surface of the substrate, the coating of the coating liquid R is not limited thereto, and the nozzle may be moved in the horizontal direction to coat the coating liquid on the top surface of the substrate.

Further, in each embodiment described above, although it is exemplified that the coating apparatus includes one nozzle (see FIG. 1), the coating apparatus may include plural sets of the nozzles and elevating mechanisms along the moving direction of the substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A coating apparatus comprising:
a nozzle extending in a longitudinal direction provided with a storage chamber that stores a coating liquid supplied from a liquid supply port through an inlet port having a slit-shape extending in the longitudinal direction and a slit-like flow path that is in communication with the storage chamber and having a depth smaller than that of the storage chamber, and configured to discharge the coating liquid to a substrate through a discharge port formed to be protruding from a front end of the flow path extending in the longitudinal direction; and
a moving mechanism configured to move the nozzle and the substrate relatively to each other along a surface of the substrate,
wherein the nozzle is configured to move in a direction perpendicular to a movement direction of the substrate in order to cover an entire length of the substrate, and
a flow path length at a central portion of the nozzle in the longitudinal direction is set to be larger than that at both end portions of the nozzle in the longitudinal direction such that a discharge amount of the coating liquid discharged from the discharge port at the central portion of the nozzle is smaller than that at both end portions of the nozzle.

2. The coating apparatus according to claim 1, wherein the nozzle has a land formed with the flow path along with the longitudinal direction of the nozzle and the central portion of the land in the longitudinal direction protrudes towards the storage chamber side.

3. The coating apparatus according to claim 2, wherein the land has a boundary portion between the land and the storage chamber, and the boundary portion is formed in a step shape when viewed from a width direction.

4. The coating apparatus according to claim 2, wherein the land has a boundary portion with the storage chamber and the boundary portion is formed in a curved shape when viewed from a width direction.

5. The coating apparatus according to claim 2, wherein the shape of the land is determined based on a thickness distribution of the coating liquid coated using a nozzle provided with a land of which the boundary portion with the storage chamber is flat.

6. The coating apparatus according to claim 1, further comprising:
a pressure adjusting unit configured to adjust the pressure inside the storage chamber; and
a pressure control unit configured to control the pressure adjusting unit to adjust the pressure inside the storage chamber such that a discharge amount of the coating liquid becomes constant while the coating liquid is being coated on the substrate.

7. The coating apparatus according to claim 1, further comprising:
a liquid surface detecting unit configured to detect a liquid surface of the coating liquid stored in the storage chamber.

8. The coating apparatus according to claim 7, further comprising:
a coating processing control unit configured to determine whether the liquid surface becomes flat based on a detection result of the liquid surface detecting unit, and when it is determined that the liquid surface become flat, to start a coating processing using the nozzle.

9. The coating apparatus according to claim 7, wherein a portion of the storage chamber is formed with a transparent material and the liquid surface detecting unit detects the liquid surface through the transparent material from the outside of the nozzle.

10. The coating apparatus according to claim 9, further comprising:
a prism configured to reflect or refract light,
wherein the liquid surface detecting unit is disposed obliquely with respect to the liquid surface at a predetermined angle and captures an image of the liquid surface viewed from a direction substantially parallel to the liquid surface through the prism.

11. The coating apparatus according to claim 6, further comprising:
a liquid supply port configured to supply the coating liquid to the storage chamber,
wherein the liquid supply port has a slit shape extending in the longitudinal direction of the flow path.

12. A nozzle comprising:
a storage chamber configured to store a coating liquid therein supplied from a liquid supply port through an inlet port having a slit-shape extending in a longitudinal direction;
a slit-like flow path that is in communication with the storage chamber and having a gap smaller than that of the storage chamber; and
a discharge port formed at a front end of the flow path and configured to discharge the coating liquid to a substrate,
wherein the nozzle is extended in a longitudinal direction perpendicular to a movement direction of a substrate in order to cover an entire length of the substrate, and
a flow path length at a central portion of the nozzle in the longitudinal direction is set to be larger than that at both end portions of the nozzle in the longitudinal direction such that a discharge amount of the coating liquid discharged from the discharge port at the central portion of the nozzle is smaller than that at both end portions of the nozzle.

* * * * *